(12) United States Patent
Gan

(10) Patent No.: US 9,455,318 B2
(45) Date of Patent: Sep. 27, 2016

(54) SEMICONDUCTOR DEVICE AND MANUFACTURING METHOD THEREOF

(71) Applicant: Semiconductor Manufacturing International (Shanghai) Corporation, Shanghai (CN)

(72) Inventor: Zhenghao Gan, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/661,944

(22) Filed: Mar. 18, 2015

(65) Prior Publication Data

US 2015/0311313 A1  Oct. 29, 2015

(30) Foreign Application Priority Data

Apr. 25, 2014  (CN) .......................... 2014 1 0169272

(51) Int. Cl.
*H01L 29/06*  (2006.01)
*H01L 29/73*  (2006.01)
*H01L 29/739*  (2006.01)

(52) U.S. Cl.
CPC ....... *H01L 29/0692* (2013.01); *H01L 29/7391* (2013.01)

(58) Field of Classification Search
CPC .................. H01L 29/0692; H01L 29/7391

USPC .......................................... 257/288; 438/197
See application file for complete search history.

(56) References Cited

U.S. PATENT DOCUMENTS

| 2007/0108534 A1* | 5/2007 | Nowak ................. H01L 29/872 257/382 |
| 2010/0230751 A1* | 9/2010 | Botula .............. H01L 21/26586 257/347 |
| 2013/0181285 A1* | 7/2013 | Ng ........................ H01L 29/402 257/335 |

* cited by examiner

*Primary Examiner* — John C Ingham
*Assistant Examiner* — Didarul Mazumder
(74) *Attorney, Agent, or Firm* — Innovation Counsel LLP

(57) ABSTRACT

A method of manufacturing a semiconductor device is provided. The method includes providing a substrate; forming a well region on the substrate; forming at least one first gate structure on the well region, wherein the first gate structure includes a gate insulating layer and a first gate electrode formed on the gate insulating layer, wherein the first gate electrode is formed having a first enclosed pattern on a surface of the well region; wherein an area inside the first enclosed pattern is defined as a first region, and an area outside the first enclosed pattern is defined as a second region; performing ion implantation on the first region such that the first region has a first conductivity type, and performing ion implantation on the second region such that the second region has a second conductivity type, wherein the first conductivity type and the second conductivity type are different.

9 Claims, 11 Drawing Sheets

SEMICONDUCTOR DEVICE AND MANUFACTURING METHOD THEREOF

CROSS-REFERENCE TO RELATED APPLICATION

This application claims priority to Chinese Patent Application No. 201410169272.4 filed on Apr. 25, 2014, the disclosure of which is incorporated herein by reference in its entirety.

BACKGROUND

1. Technical Field

The present disclosure relates to a semiconductor device and a manufacturing method thereof.

2. Description of the Related Art

Electrostatic discharge (ESD) is a key factor affecting the reliability of integrated circuits. ESD is the rapid neutralization of electrical charges. The high electrostatic voltage in ESD can damage and cause failures in an integrated circuit. To protect the integrated circuit from damage due to ESD, an ESD protection circuit may be fabricated into the integrated circuit.

A gated diode has faster speeds, lower resistance, and higher fault current compared to a conventional STI (Shallow Trench Isolation) diode. Accordingly, the gated diode is increasingly being used in the ESD protection circuit.

FIG. 1 illustrates a gated diode of an ESD protection circuit in the prior art. Referring to FIG. 1, the gated diode is formed having a long striped pattern. The gated diode includes an active area comprising a $P^+$ conductive region 1, a gate electrode 2, and an $N^+$ conductive region 3. The length of the active area is given by W. The widths of the $P^+$ conductive region 1, gate electrode 2, and $N^+$ conductive region 3 are given by Lp, Lg, and Ln, respectively.

FIG. 2 is a cross-sectional view of the gated diode of FIG. 1. As shown in FIG. 2, conduction current in the gated diode flows from the $P^+$ conductive region 1 to the $N^+$ conductive region 3 (in the direction indicated by the arrows 4).

To obtain adequate ESD protection, the size of the gated diode needs to be increased. However, increasing the size of the gated diode may result in increased parasitic capacitance which could impact device performance. In particular, the performance degradation is more significant for high speed RF (Radio Frequency) integrated circuits.

SUMMARY

The present disclosure addresses at least the above issues relating to the conventional gated diode in an ESD protection circuit.

According to one embodiment of the inventive concept, a method of manufacturing a semiconductor device is provided. The method includes providing a substrate; forming a well region on the substrate; forming at least one first gate structure on the well region, wherein the first gate structure includes a gate insulating layer and a first gate electrode formed on the gate insulating layer, wherein the first gate electrode is formed having a first enclosed pattern on a surface of the well region; wherein an area inside the first enclosed pattern is defined as a first region, and an area outside the first enclosed pattern is defined as a second region; performing ion implantation on the first region such that the first region has a first conductivity type, and performing ion implantation on the second region such that the second region has a second conductivity type, wherein the first conductivity type and the second conductivity type are different.

In some embodiments, the method may further include forming a first isolation region in the first region, wherein the first isolation region is spaced apart from a boundary of the first region.

In some embodiments of the method, a ratio of a perimeter length of the first isolation region to a perimeter length of the first region may range from about 0.25 to about 0.75.

In some embodiments, the method may further include forming a second gate structure on the well region, wherein the second gate structure is spaced apart from the first gate structure, wherein the second gate structure includes the gate insulating layer and a second gate electrode formed on the gate insulating layer, wherein the second gate electrode is formed having a second enclosed pattern on the surface of the well region, and the second enclosed pattern is surrounded by the first region, wherein an area inside the second enclosed pattern is defined as a third region; and performing ion implantation on the third region such that the third region has the second conductivity type.

In some embodiments, the method may further include forming a second isolation region in the third region, wherein the second isolation region is spaced apart from a boundary of the third region.

In some embodiments of the method, a ratio of a perimeter length of the second isolation region to a perimeter length of the third region may range from about 0.25 to about 0.75.

In some embodiments of the method, the well region may be a P-type well region, the first region having the first conductivity type may be an $N^+$ conductive region, and the second region having the second conductivity type may be a $P^+$ conductive region.

In some embodiments of the method, the first gate electrode may be a polysilicon gate, and a distance between adjacent first gate electrodes may range from about 0.1 μm to about 2 μm.

In some embodiments of the method, an inner contour and an outer contour of the first enclosed pattern, and an outer contour of the first isolation region, may have at least one of the following shapes: quadrilateral, pentagonal, hexagonal, octagonal, circular, and elliptical.

In some embodiments of the method, an outer contour and an inner contour of the first enclosed pattern, and an outer contour and an inner contour of the second enclosed pattern, may have the same respective shapes.

According to another embodiment of the inventive concept, a semiconductor device is provided. The semiconductor device includes a substrate; a well region disposed on the substrate; at least one first gate structure disposed on the well region, wherein the first gate structure includes a gate insulating layer and a first gate electrode formed on the gate insulating layer, wherein the first gate electrode is formed having a first enclosed pattern on a surface of the well region, wherein an area inside the first enclosed pattern is defined as a first region, and an area outside the first enclosed pattern is defined as a second region, wherein the first region has a first conductivity type, and the second region has a second conductivity type, and wherein the first conductivity type and the second conductivity type are different.

In some embodiments, the semiconductor device may further include a first isolation region disposed in the first region, wherein the first isolation region is spaced apart from a boundary of the first region.

In some embodiments of the semiconductor device, a ratio of a perimeter length of the first isolation region to a perimeter length of the first region may range from about 0.25 to about 0.75.

In some embodiments, the semiconductor device may further include: a second gate structure disposed on the well region, wherein the second gate structure is spaced apart from the first gate structure, wherein the second gate structure includes the gate insulating layer and a second gate electrode formed on the gate insulating layer, wherein the second gate electrode is formed having a second enclosed pattern on the surface of the well region, and the second enclosed pattern is surrounded by the first region, wherein an area inside the second enclosed pattern is defined as a third region, and the third region has the second conductivity type.

In some embodiments, the semiconductor device may further include a second isolation region disposed in the third region, wherein the second isolation region is spaced apart from a boundary of the third region.

In some embodiments of the semiconductor device, a ratio of a perimeter length of the second isolation region to a perimeter length of the third region may range from about 0.25 to about 0.75.

In some embodiments of the semiconductor device, the well region may be a P-type well region, the first region having the first conductivity type may be an $N^+$ conductive region, and the second region having the second conductivity type may be a $P^+$ conductive region.

In some embodiments of the semiconductor device, the first gate electrode may be a polysilicon gate, and a distance between adjacent first gate electrodes may range from about 0.1 µm to about 2 µm.

In some embodiments of the semiconductor device, an inner contour and an outer contour of the first enclosed pattern, and an outer contour of the first isolation region, may have at least one of the following shapes: quadrilateral, pentagonal, hexagonal, octagonal, circular, and elliptical.

In some embodiments of the semiconductor device, an outer contour and an inner contour of the first enclosed pattern, and an outer contour and an inner contour of the second enclosed pattern, may have the same respective shapes.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1:
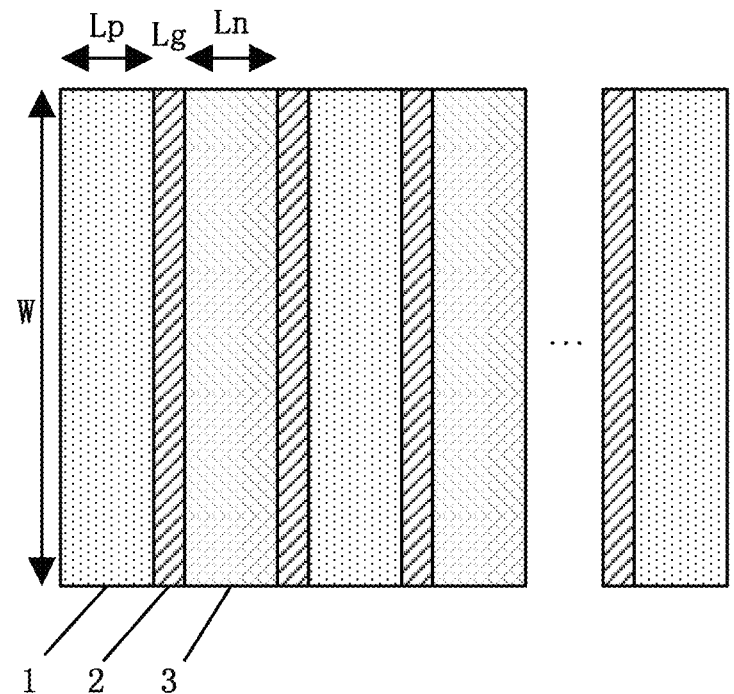
FIG. 1 depicts a plan view of a conventional gated diode having a long striped pattern.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

It should be understood that the inventive concept is not limited to the embodiments described herein. Rather, the inventive concept may be modified in different ways to realize different embodiments.

Referring to FIG. 1, the current conduction capability of the conventional gated diode is dependent upon the outer contour length (i.e. conductive length) of the $N^+$ conductive region 3. The size of a parasitic capacitance 5 is determined by the size of the bottom area of the $N^+$ conductive region 3. In an ESD protection circuit, the gated diode should preferably have high current conduction capability and low parasitic capacitance.

In the present disclosure, a parameter k is defined, whereby k is a ratio of the conductive length to the bottom area of the $N^+$ conductive region (i.e., k=conductive length/bottom area). The ESD protection capability of the gated diode improves as the parameter k increases.

Figure 2:
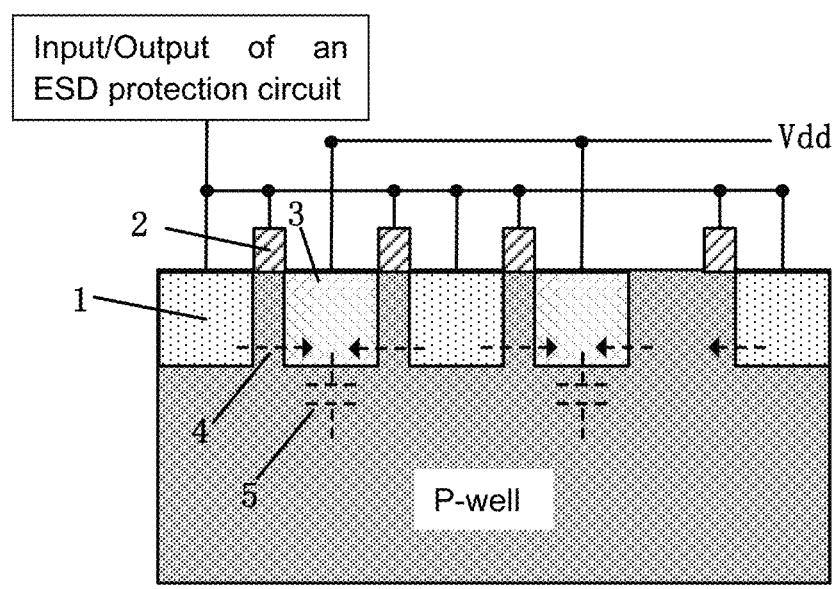
FIG. 2 depicts a schematic cross-sectional view of the conventional gated diode of FIG. 1.

Referring to the conventional gated diode in FIGS. 1 and 2, its conductive length is given by 2W, and the bottom area of the N+ conductive region 3 is given by W×Ln. Accordingly, the parameter k(0) of the conventional gated diode is given by:

$$k(0) = \frac{2 \times W}{W \times Ln} = \frac{2}{Ln}$$

The inventive concept discloses an exemplary gated diode having increased current conduction capability and lower parasitic capacitance compared to the conventional gated diode. Specifically, the parameter k of the exemplary gated diode is higher than the parameter k(0) of the conventional gated diode. Accordingly, the exemplary gated diode has improved ESD protection capability compared to the conventional gated diode.

Figure 3:
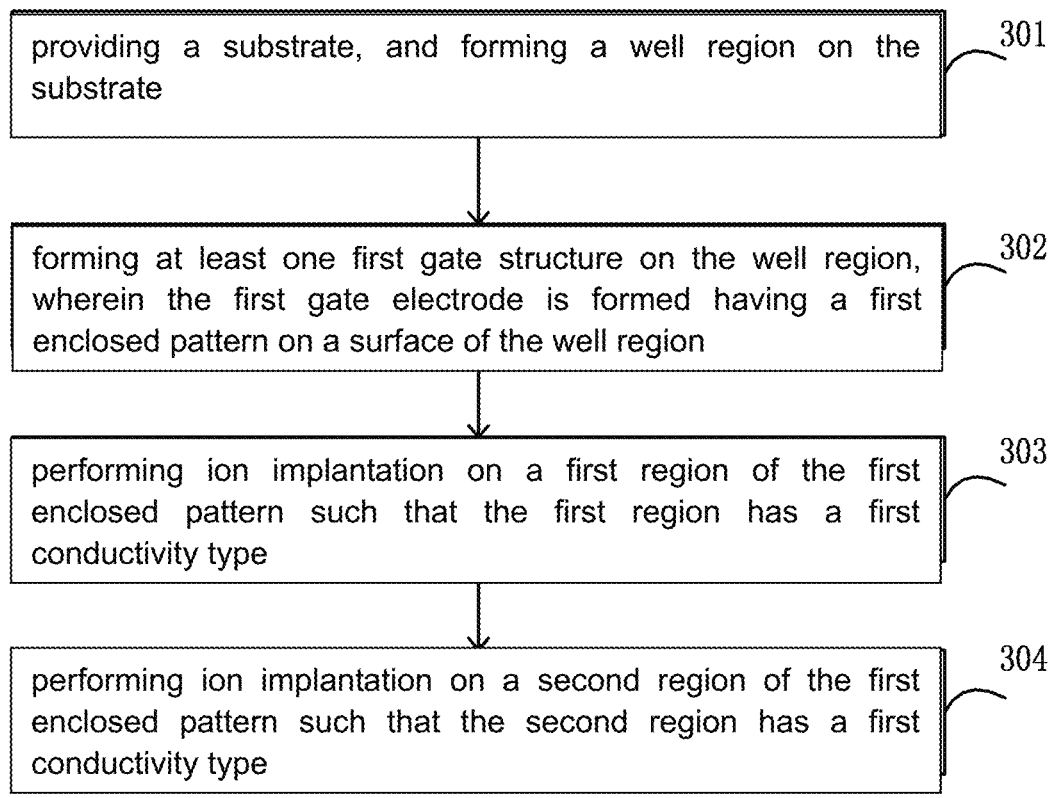
FIG. 3 is a flowchart illustrating a method of manufacturing a semiconductor device according to an embodiment of the inventive concept.

FIG. 3 is a flowchart illustrating a method of manufacturing a semiconductor device according to an embodiment of the inventive concept. The method includes the following steps.

Referring to Step 301, a substrate is provided, and a well region is formed in the substrate. In one embodiment, the well region may be a P-type well region. In one embodiment, Step 301 may further include forming separation grooves on the substrate, and forming the well region (between the separation grooves) on the substrate.

Referring to Step 302, at least one first gate structure is formed on the well region. The first gate structure may include a gate insulating layer and a first gate electrode formed on the gate insulating layer. The first gate electrode on the well region is formed having a first enclosed pattern. The area inside the first enclosed pattern is defined as a first region, and the area outside the first enclosed pattern is defined as a second region.

In one embodiment, the first gate electrode may be formed of polysilicon.

In one embodiment, a plurality of first gate structures may be formed, and a distance between adjacent first gate electrodes may range from about 0.1 μm to about 2 μm.

In one embodiment, a plurality of first gate structures may be formed, whereby the gate structures may be spaced apart from each at different intervals, and the gate structures may be formed having different shapes and sizes.

In one embodiment, a plurality of first gate structures may be formed, whereby the gate structures may have different sizes and are formed in a nested structure.

In one embodiment, the method may further include forming a first isolation region in the first region, whereby the first isolation region is spaced apart from a boundary of the first region. Preferably, the first isolation region may be formed at the same time as the separation grooves in Step 301.

In one embodiment, a ratio of the perimeter length of the first isolation region to the perimeter length of the first region may range from about 0.25 to about 0.75.

In one embodiment, an inner contour and an outer contour of the first enclosed pattern, and an outer contour of the first isolation region, may have at least one of the following shapes: quadrilateral, pentagonal, hexagonal, octagonal, circular, and elliptical.

In one embodiment, at least two gate structures may be formed in a nested structure. The nested structure may be formed as follows. For example, a second gate structure may be formed on the well region such that the second gate structure is spaced apart from the first gate structure. The second gate structure includes the gate insulating layer and a second gate electrode formed on the gate insulating layer. The second gate electrode on the well region is formed having a second enclosed pattern. The second enclosed pattern is surrounded by the first enclosed pattern, such that the area inside the second enclosed pattern is defined as a third region.

In one embodiment, the first and second gate structures may be formed simultaneously.

In one embodiment, the second gate electrode may be formed of polysilicon.

In one embodiment, the method may further include forming a second isolation region in the third region, whereby the second isolation region is spaced apart from a boundary of the third region. Preferably, the second isolation region may be formed at the same time as the separation grooves in Step 301.

In one embodiment, a ratio of the perimeter length of the second isolation region to the perimeter length of the third region may range from about 0.25 to about 0.75.

In one embodiment, the outer contour and the inner contour of the second enclosed pattern may have the same shape as the outer contour and the inner contour of the first enclosed pattern.

Referring to Step 303, ion implantation is performed on the first region to form a region having a first conductivity type. In one embodiment, the region having the first conductivity type may be an N+ region.

Referring to Step 304, ion implantation is performed on the second region to form a region having a second conductivity type, whereby the second conductivity type is different from the first conductivity type.

In one embodiment, if the second gate structure is formed in Step 302, the method may further include performing ion implantation on the third region to form a region having the second conductivity type.

In one embodiment, the region having the second conductivity type may be a P+ conductive region.

In one embodiment, the inner contour of the first enclosed pattern may be any closed pattern, whereby the ratio of the perimeter length of the inner contour to the area of the N+ conductive region satisfies the following condition:

$$k > \frac{2}{Ln} = k(0)$$

whereby Ln is a width of a conventional long striped pattern gated diode.

In one embodiment in which the semiconductor device does not include the isolation region or the second gate structure, the following condition is still satisfied:

$$k > \frac{2}{Ln} = k(0)$$

Comparing the semiconductor device in the above embodiment to an equivalent conventional long striped pattern gated diode in which both have the same ESD protection capability, the semiconductor device has lower parasitic capacitance compared to the conventional gated diode. Accordingly, the exemplary semiconductor device can help to improve the circuit performance of an RF integrated circuit.

In one embodiment, when the semiconductor device includes an isolation region, the isolation region is formed within the N+ conductive region, thereby reducing the area of the N+ conductive region. Accordingly, the parameter k is increased in the above embodiment. Comparing the aforementioned semiconductor device (having increased k) to an equivalent conventional long striped pattern gated diode in which both have the same ESD protection capability, the aforementioned semiconductor device has much lower parasitic capacitance compared to the conventional gated diode. Accordingly, the aforementioned semiconductor device can help to further improve the circuit performance of the RF integrated circuit.

In one embodiment, when the semiconductor device includes a second gate structure, the P+ conductive region and the second gate electrode are formed within the N+ conductive region, thereby further reducing the area of the N+ conductive region. In addition, the current path from the P+ conductive region to the N+ conductive region is increased. The aforementioned semiconductor device has improved ESD protection capability and lower parasitic capacitance compared to the conventional gated diode. Accordingly, the aforementioned semiconductor device can help to further improve the circuit performance of the RF integrated circuit.

Next, the method of FIG. 3 will be described with reference to FIGS. 3-11, which depict different views of the semiconductor device at different stages of manufacture according to a first embodiment of the inventive concept.

First Embodiment

The method of manufacturing the semiconductor device according to the first embodiment includes the following steps.

Figure 4:
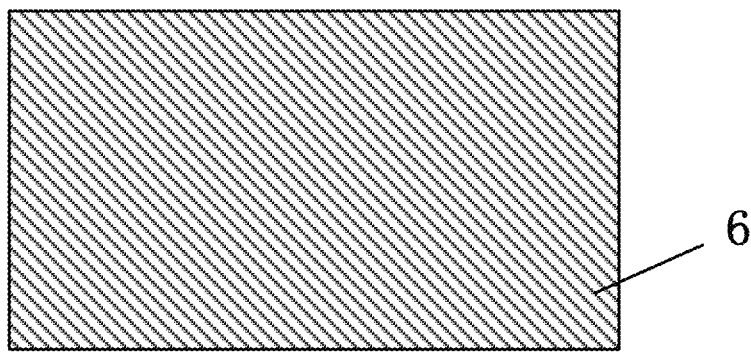
FIGS. 4-11 depict different views of the semiconductor device at different stages of manufacture according to a first embodiment of the inventive concept.

First, as shown in FIG. 4, a substrate 6 is provided. In one embodiment, the substrate 6 may be a silicon substrate. In one embodiment, the substrate 6 may include a base layer, an epitaxial layer, and an oxide layer. Specifically, FIG. 4 is a schematic cross-sectional view of the semiconductor device taken along a direction perpendicular to the surface of the substrate 6.

Figure 5:
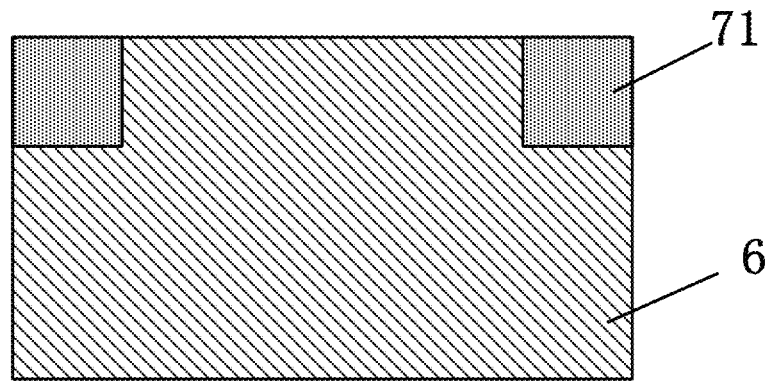

Next, as shown in FIG. 5, an isolation trench 71 is formed in the substrate 6. In one embodiment, the isolation trench 71 is formed as a shallow isolation trench. In one embodiment, forming the isolation trench 71 on the substrate 6 includes: etching the substrate 6 to form the isolation trench 71; filling the isolation trench 71 using a high-density plasma chemical vapor deposition process; and performing chemical mechanical polishing (CMP) for planarization. Specifically, FIG. 5 is a schematic cross-sectional view of the semiconductor device taken along a direction perpendicular to the surface of the substrate 6 after the isolation trench 71 has been filled/planarized.

Figure 6:
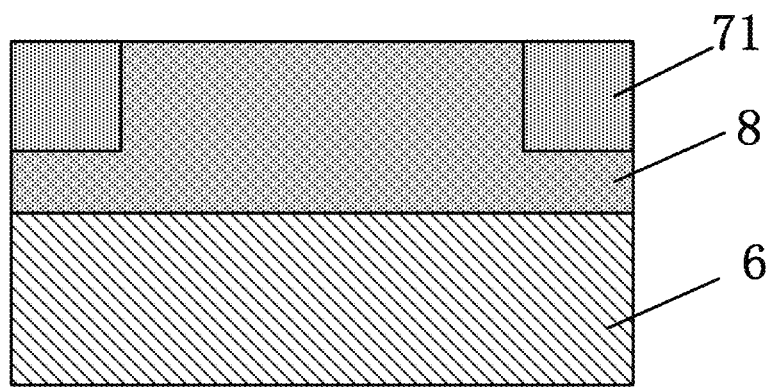

Next, as shown in FIG. 6, ion implantation is performed on the substrate 6 to form a well region 8. In a preferred embodiment, boron ion implantation may be carried out at a power of about 100~200 keV, and at a dosage of about $10^{13}$ $cm^{-2}$, to form a P-well. Specifically, FIG. 6 is a schematic cross-sectional view of the semiconductor device taken along a direction perpendicular to the surface of the well region 8 after the well region 8 has been formed.

Figure 7:
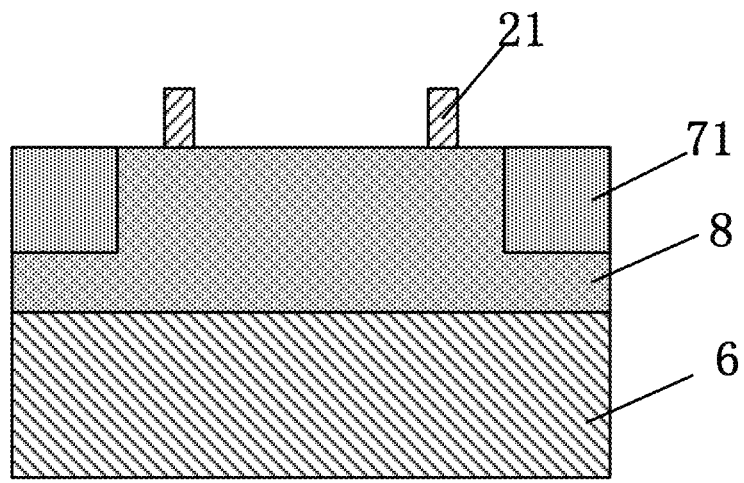
Figure 8:
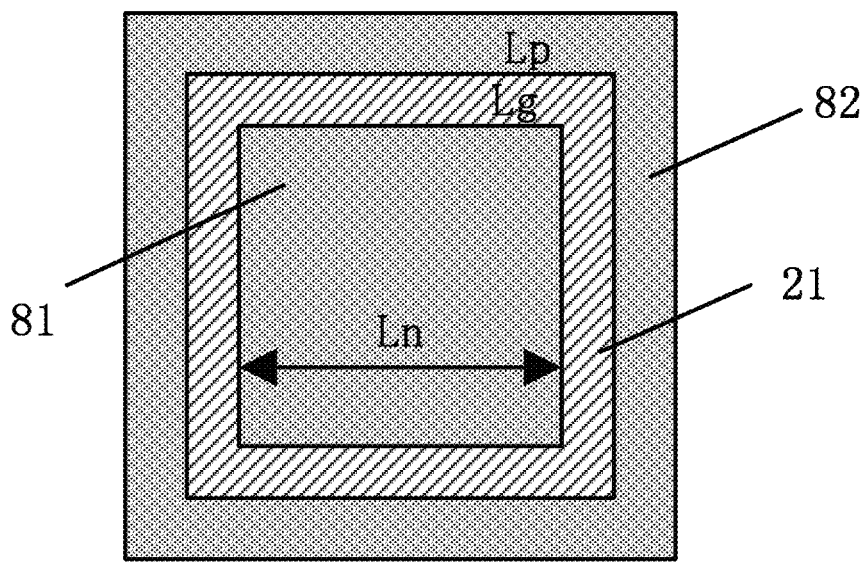

Next, as shown in FIGS. 7 and 8, a first gate structure is formed on the well region 8.

The first gate structure includes a gate insulating layer (not shown) and a first gate electrode 21 formed on the gate insulating layer. The first gate electrode 21 is formed having a first enclosed pattern on the surface of the well region 8. The area inside the first enclosed pattern is defined as a first region 81, and the area outside the first enclosed pattern is defined as a second region 82. Specifically, FIG. 7 is a schematic cross-sectional view of the semiconductor device taken along a direction perpendicular to the surface of the well region 8 after the first gate structure has been formed. FIG. 8 is a plan view of an active region of the semiconductor device after the first gate structure has been formed.

In a preferred embodiment, the first gate electrode 21 may be a polysilicon gate.

In one embodiment, forming the first gate structure on the well region 8 may include forming the gate insulating layer on the well region 8, and depositing polycrystalline silicon on the gate insulating layer to form a polysilicon gate (i.e. the first gate electrode 21).

In one embodiment, the first enclosed pattern may be formed as an annular ring.

In one embodiment, the outer contour and the inner contour of the first enclosed pattern have a square shape. Accordingly, the outer contours of the first region 81 and the second region 82 are formed as symmetric squares with respect to the center of the first enclosed pattern. As shown in FIG. 8, the first region 81 is a square having a width Ln, the first enclosed pattern is an annular square ring having a width Lg, and the second region 82 is an annular square ring having a width Lp.

Figure 9:
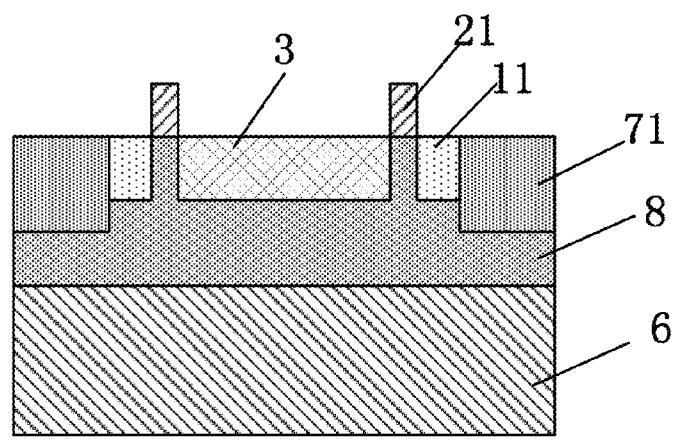
Figure 10:
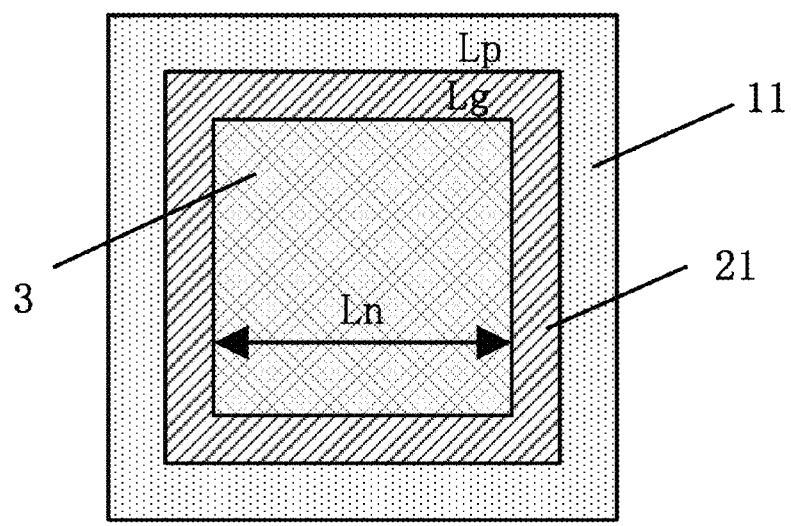

Next, as shown in FIGS. 9 and 10, ion implantation is performed in the first region 81 to form a region 3 of a first conductivity type, ion implantation is performed in the second region 82 to form a region 11 of a second conductivity type, wherein the first conductivity type and the second conductivity type are different. In one embodiment, the region 3 of the first conductivity type is an N+ conductive region and the region 11 of the second conductivity type is a P+ conductive region. As shown in FIG. 10, the outer contour and the inner contour of the first enclosed pattern have a square shape. Accordingly, the outer contours of the P+ conductive region and the N+ conductive region are formed as symmetric squares with respect to the center of the first enclosed pattern. Specifically, the N+ conductive region is a square having the width Ln, the first enclosed pattern is an annular square ring having the width Lg, and the P+ conductive region is an annular square ring having the width Lp. FIG. 9 is a schematic cross-sectional view of the semiconductor device taken along a direction perpendicular to the surface of the conductive regions (i.e. the N+ and P+ conductive regions) after the conductive regions have been formed. FIG. 10 is a plan view of the active region of the semiconductor device after the conductive regions have been formed.

In one embodiment, forming the N+/P+ conductive regions may include forming a spacer (e.g. a silicon nitride spacer) on the first gate electrode 21, performing N+/P+ ion implantation, and performing a silicidation process on the N+/P+ conductive regions.

In one embodiment, Lp and Lg may range from about 0.1 μm to about 2 μm, and Ln may range from about 0.1 μm to about 10 μm.

Figure 11:
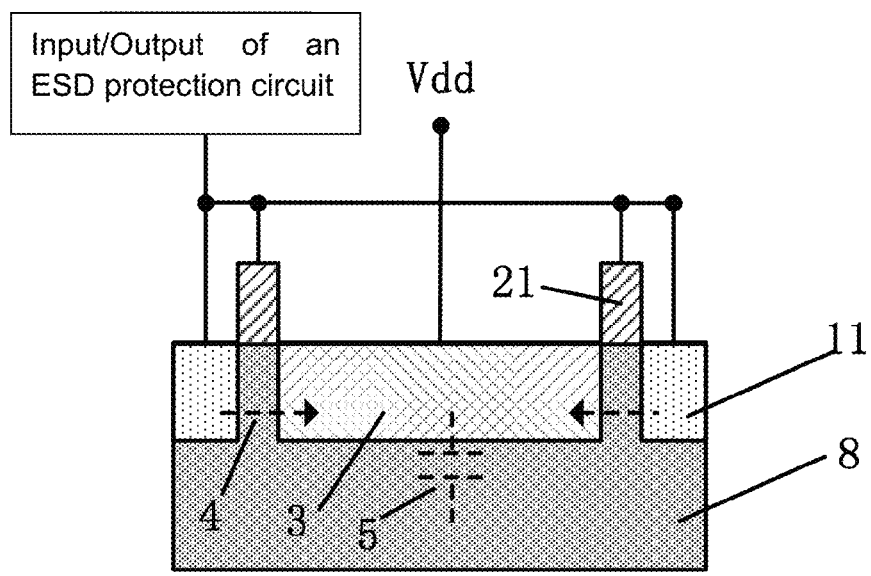

Next, after the isolation layer has been deposited and processed, an ESD protection circuit is fabricated into the semiconductor device. As shown in FIG. 11, the first gate electrode 21 and the P+ conductive region 11 are connected to the input/output of the ESD protection circuit, and the N+ conductive region 3 is connected to the power supply (Vdd). FIG. 11 illustrates the connectivity between the components of the semiconductor device according to the first embodiment of the inventive concept. As shown in FIGS. 10 and 11, according to the first embodiment of the semiconductor device, conduction current flows from the P⁺ conductive region 11 (in a direction perpendicular to the four sides of the N⁺ conductive region 3) into the N⁺ conductive region 3. Accordingly, the parameter k(1) of the first embodiment of the semiconductor device is given by the ratio of the perimeter length to the area of the (square-shaped) N⁺ conductive region 3:

$$k(1) = \frac{4 \times Ln}{Ln \times Ln} = \frac{4}{Ln} > \frac{2}{Ln} = k(0)$$

The parameter k(1) of the first embodiment of the semiconductor device is greater than the parameter k(0) of the conventional long striped pattern gated diode. Comparing the first embodiment of the semiconductor device to an equivalent conventional long striped pattern gated diode in which both have the same ESD protection capability, the first embodiment of the semiconductor device has lower parasitic capacitance compared to the conventional gated diode. Accordingly, the first embodiment of the semiconductor device can help to improve the circuit performance of an RF integrated circuit.

Second Embodiment

Figure 12:
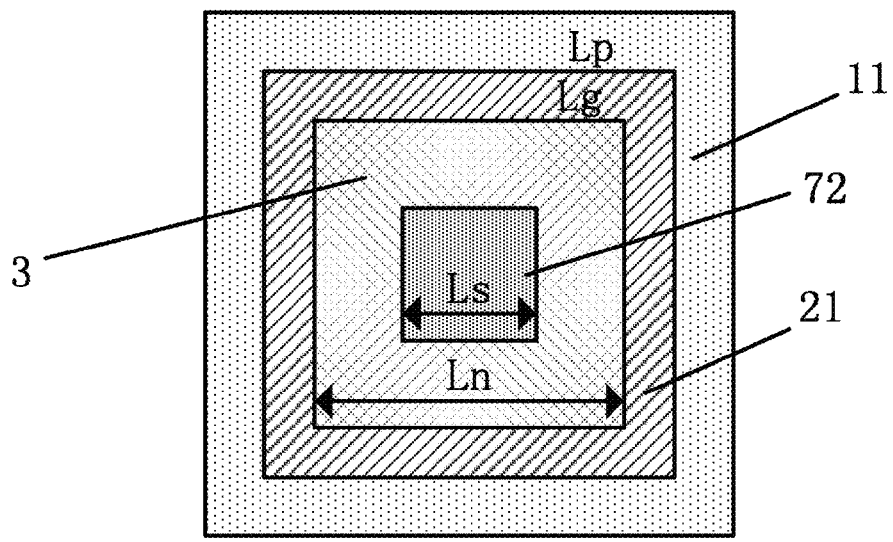
FIGS. 12 and 13 respectively depict a plan view and a schematic cross-sectional view of a semiconductor device according to a second embodiment of the inventive concept.
Figure 13:
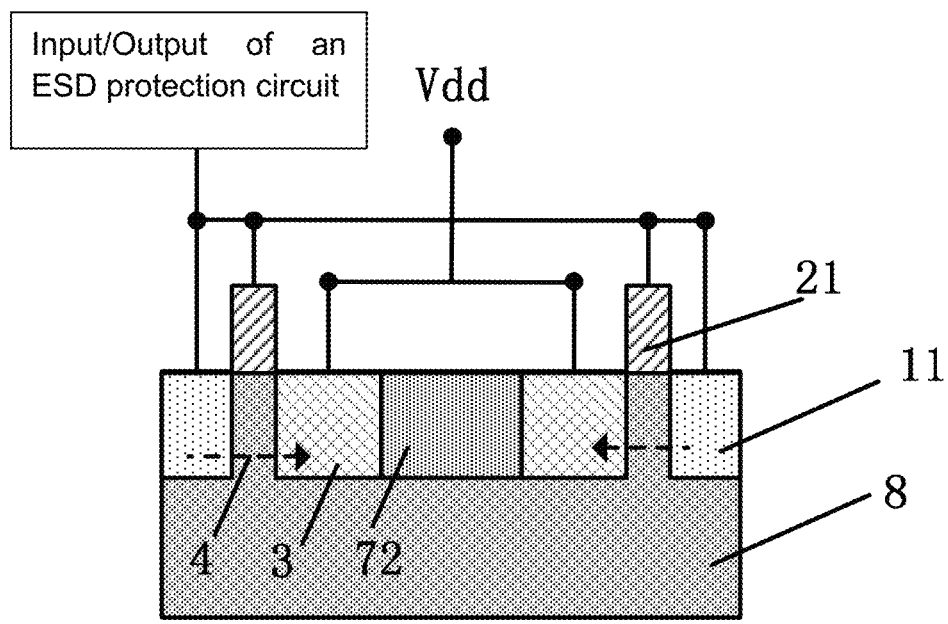

FIGS. 12 and 13 respectively depict a plan view and a schematic cross-sectional view of a semiconductor device according to a second embodiment of the inventive concept.

The second embodiment of the semiconductor device can be manufactured using some or all the steps previously described with reference to FIGS. 3-11. The first and second embodiments of the semiconductor device are similar except for the following differences.

Referring to FIG. 12, an isolation region 72 may be formed in a first region, whereby the isolation region 72 is spaced apart from a boundary of the first region. FIG. 12 is a plan view of the active region of the second embodiment of the semiconductor device after the conductive regions have been formed. Similar to FIG. 10, the N⁺ conductive region 3 in FIG. 12 is a square having the width Ln. In contrast to FIG. 10, the embodiment in FIG. 12 further includes the isolation region 72 formed as a square that is symmetric to the outer contour of the N⁺ conductive region 3. The width of the isolation region 72 is given by Ls (where Ls is less than Ln).

Referring to FIG. 12, conduction current flows from the P⁺ conductive region 11 (in a direction perpendicular to the four sides of the N⁺ conductive region 3) into the N⁺ conductive region 3, and therefore the numerator of the parameter k (conductive length) remains unchanged. However, the area of the N⁺ conductive region 3 is reduced by the isolation region 72. Accordingly, the parameter k(2) of the second embodiment of the semiconductor device is given by:

$$k(2) = \frac{4 \times Ln}{Ln \times Ln - Ls \times Ls} = \frac{4}{Ln - \frac{Ls^2}{Ln}} > \frac{4}{Ln} > k(1)$$

In the second embodiment of the semiconductor device, the area of the N⁺ conductive region is decreased and as a result, parasitic capacitance is reduced. Accordingly, the ESD protection capability is improved which helps to further improve the circuit performance of an RF integrated circuit.

In one embodiment, Lp and Lg may range from about 0.1 μm to about 2 μm, and Ln may range from about 0.1 μm to about 10 μm.

In one embodiment, the ratio of the perimeter lengths of the isolation region and the first region is equal to the ratio of the widths of the isolation region and the first region (Ls/Ln). The ratio Ls/Ln may range from about 0.25 to about 0.75.

In one embodiment, the isolation region 72 may be formed in the first region at the same time when forming the isolation trench 71 in the substrate (refer back to the first embodiment depicted in FIG. 5).

Since the other manufacturing process steps in the first and second embodiments are similar, a detailed description of those similar process steps shall be omitted. FIG. 13 illustrates the connectivity between the components of the semiconductor device according to the second embodiment of the inventive concept. Specifically, FIG. 13 illustrates the circuit connections in the active region after the conductive regions have been formed.

In the second embodiment of the semiconductor device, the shape of the isolation region 72 may be different from the shape of the N⁺ conductive region. The shape of the isolation region 72 may be pentagonal, hexagonal, octagonal, circular, oval, or any closed shape.

In the second embodiment of the semiconductor device, a plurality of cell structures may be formed within the isolation region 72, so as to form a nested structure. Each cell structure includes the N⁺ conductive region, gate electrodes, and P⁺ conductive region (extending in an outward direction). The conduction current can be further increased using the nested structure, thereby improving the current conduction capability of the semiconductor device.

Third Embodiment

Figure 14:
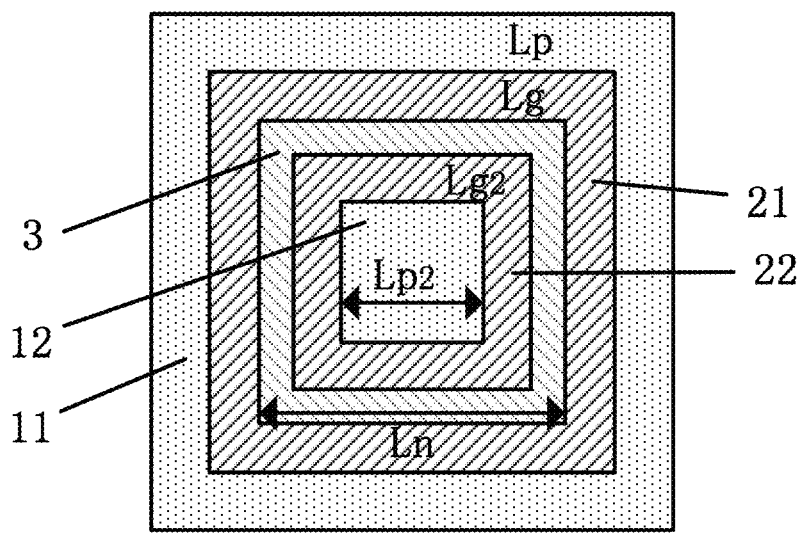
FIGS. 14 and 15 respectively depict a plan view and a schematic cross-sectional view of a semiconductor device according to a third embodiment of the inventive concept.
Figure 15:
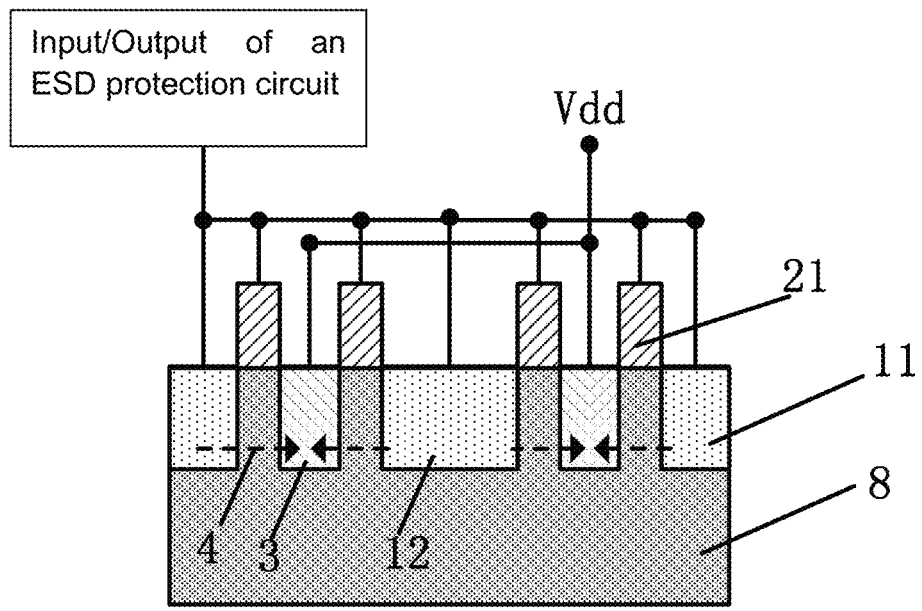

FIGS. 14 and 15 respectively depict a plan view and a schematic cross-sectional view of a semiconductor device according to a third embodiment of the inventive concept.

The third embodiment of the semiconductor device can be manufactured using some or all the steps previously described with reference to FIGS. 3-11. The second and third embodiments of the semiconductor device are similar except for the following differences.

Referring to FIG. 14, a second gate structure may be formed on the well region, whereby the second gate structure is spaced apart from the first gate structure. The second gate structure may include the gate insulating layer and a second gate electrode 22 formed on the gate insulating layer. The second gate electrode on the well region is formed having a second enclosed pattern, with the second enclosed pattern being surrounded by the first region. The area inside the second enclosed pattern is defined as a third region. Ion implantation is performed on the third region to form a region of the second conductivity type. FIG. 14 is a plan view of the active region of the third embodiment of the semiconductor device after the conductive regions have been formed.

Similar to FIG. 10, the N⁺ conductive region 3 in FIG. 14 is a square having the width Ln. In contrast to FIG. 10, the embodiment in FIG. 14 further includes the square-shaped P⁺ conductive region 12 and the second gate electrode 22 formed symmetrically within the N⁺ conductive region 3. The centers of the P⁺ conductive region 12 and the second gate electrode 22 coincide with the center of the outer contour of the N⁺ conductive region 3. The outer contour of the second gate electrode 22 is a square having a width $Lg_2$. A width of the third region is the same as a width of the P⁺ conductive region 12 and is given by $Lp_2$, such that $Lp_2 < Lg_2 < Ln$.

In one embodiment, Lp and Lg may range from about 0.1 μm to about 2 μm. Ln, $Lp_2$, and $Lg_2$ may range from about 0.1 μm to about 10 μm.

In one embodiment, the second gate structure may be formed at the same time as the first gate structure (refer back to the first embodiment depicted in FIG. 7). As previously described, the first gate structure is formed on the substrate, and the second gate structure is formed spaced apart from the first gate structure on the well region.

In one embodiment, ion implantation is performed on the third region to form a region of a second conductivity type (i.e. the P⁺ conductive region 12 having a width $Lp_2$). The ion implantation on the third region may be performed at the same time as the ion implantation on the second region (refer back to first embodiment depicted in FIG. 9). As previously described, ion implantation is performed on the second region to a form a region having a second conductivity type (i.e. the P⁺ conductive region 11). In other words, the P⁺ conductive regions in the second and third regions may be simultaneously formed.

Since the other manufacturing process steps in the first and third embodiments are similar, a detailed description of those similar process steps shall be omitted. FIG. 15 illustrates the connectivity between the components of the semiconductor device according to the third embodiment of the inventive concept. Specifically, FIG. 15 illustrates the circuit connections in the active region after the conductive regions have been formed.

As shown in FIGS. 14 and 15, according to the third embodiment of the semiconductor device, conduction current flows inward from the P⁺ conductive region 11 towards the square-shaped N⁺ conductive region 3, and outward from the P⁺ conductive region 12 towards the square-shaped N⁺ conductive region 3. The numerator of the parameter k (conductive length) is greater in the third embodiment of FIG. 14 than in the first embodiment of FIG. 10. In addition, the area of the N⁺ conductive region 3 is reduced by the P⁺ conductive region 12 (having the width $Lp_2$) since the P⁺ conductive region 12 is formed within the N⁺ conductive region 3. Accordingly, the parameter k(3) of the third embodiment of the semiconductor device is given by:

$$k(3) = \frac{4 \times Ln + 4 \times Lp_2}{Ln \times Ln - Lg_2 \times Lg_2} = \frac{4\left(1 + \frac{Lp_2}{Ln}\right)}{Ln - \frac{Lg_2^2}{Ln}} > \frac{4}{Ln} > k(1)$$

Referring to FIG. 14, the semiconductor device according to the third embodiment further includes the second gate electrode 22 and the P⁺ conductive regions 11 and 12. Accordingly, the conduction current is increased, thereby increasing the numerator of the parameter k.

At the same time, the area of the N⁺ conductive region 3 is reduced, thereby decreasing the denominator of the parameter k. Accordingly, the parasitic capacitance is reduced and the ESD protection capability is improved. Accordingly, the third embodiment of the semiconductor device can help to further improve the circuit performance of an RF integrated circuit.

Fourth Embodiment

Figure 16:
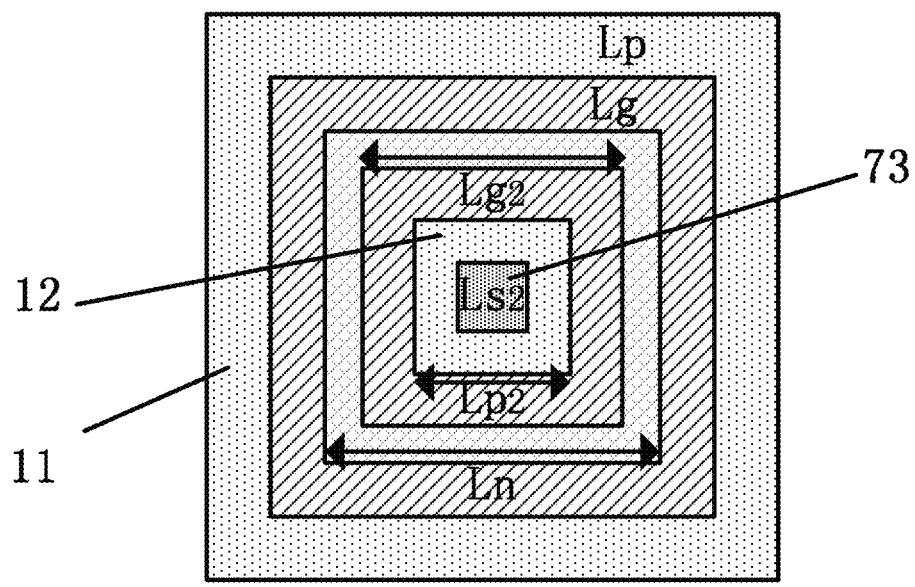
FIGS. 16 and 17 respectively depict a plan view and a schematic cross-sectional view of a semiconductor device according to a fourth embodiment of the inventive concept.
Figure 17:
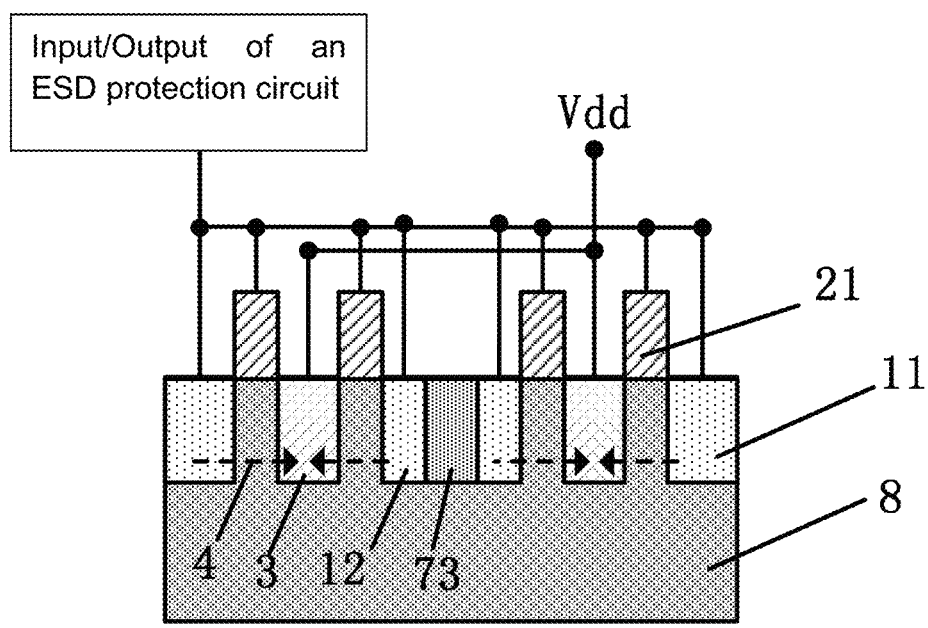

FIGS. 16 and 17 respectively depict a plan view and a schematic cross-sectional view of a semiconductor device according to a fourth embodiment of the inventive concept.

The fourth embodiment of the semiconductor device can be manufactured using some or all the steps previously described with reference to FIGS. 3-11. The fourth and third embodiments of the semiconductor device are similar except for the following differences.

Referring to FIG. 16, an isolation region 73 is formed in the third region, whereby the isolation region 73 is spaced apart from a boundary of the third region. FIG. 16 is a plan view of the active region of the fourth embodiment of the semiconductor device after the conductive regions have been formed.

Similar to FIG. 14, the P⁺ conductive region 12 in FIG. 16 is a square having the width $Lp_2$. In contrast to FIG. 14, the embodiment in FIG. 16 further includes the square-shaped isolation region 73 formed within the P⁺ conductive region 12, and that is symmetric with the outer contour of the P⁺ conductive region 12. The centers of the isolation region 73 and the P⁺ conductive region 12 coincide with each other. A width of the square-shaped isolation region 73 is given by $Ls_2$, whereby $Ls_2 < Lp_2 < Lg_2 < Ln$.

In one embodiment, Lp and Lg may range from about 0.1 μm to about 2 μm. Ln, $Ls_2$, $Lp_2$, and $Lg_2$ may range from about 0.1 μm to about 10 μm.

Referring to FIG. 16, the flow of the conduction current and the area of the N⁺ conductive region in the fourth embodiment of the semiconductor device are the same as the third embodiment. Accordingly, the parameter k(4) of the fourth embodiment of the semiconductor device is the same as the parameter k(3) in the third embodiment:

$$k(4) = k(3) = \frac{4 \times Ln + 4 \times Lp_2}{Ln \times Ln - Lg_2 \times Lg_2} = \frac{4\left(1 + \frac{Lp_2}{Ln}\right)}{Ln - \frac{Lg_2^2}{Ln}} > \frac{4}{Ln} > k(1)$$

The fourth embodiment is similar to the third embodiment in that the parasitic capacitance is reduced and the ESD protection capability is improved. Accordingly, the fourth embodiment of the semiconductor device can help to further improve the circuit performance of an RF integrated circuit.

In one embodiment, the ratio of the perimeter lengths of the isolation region and the third region is equal to the ratio of the widths of the isolation region and the third region ($Ls_2/Lp_2$). The ratio $Ls_2/Lp_2$ may range from about 0.25 to about 0.75.

In one embodiment, the isolation region 73 may be formed in the third region at the same time when forming the isolation trench 71 in the substrate (refer back to the first embodiment depicted in FIG. 5).

Since the other manufacturing process steps in the third and fourth embodiments are similar, a detailed description of those similar process steps shall be omitted. FIG. 17 illustrates the connectivity between the components of the semiconductor device according to the fourth embodiment of the inventive concept. Specifically, FIG. 17 illustrates the circuit connections in the active region after the conductive regions have been formed.

Fifth Embodiment

Figure 18:
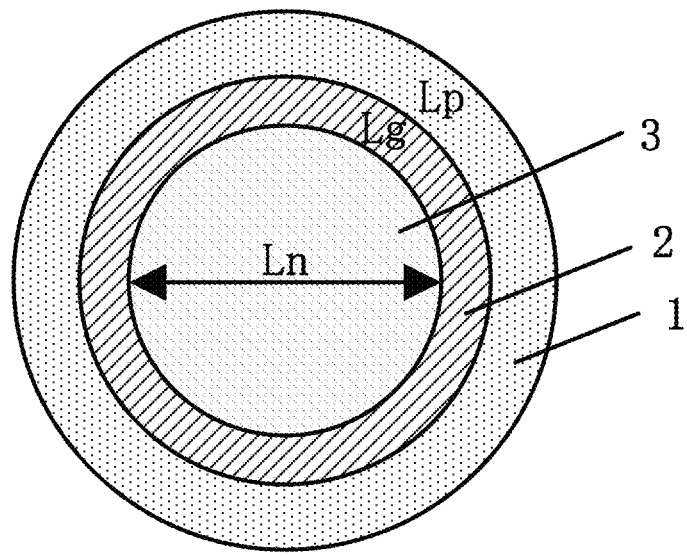
FIG. 18 depicts a plan view of a semiconductor device according to a fifth embodiment of the inventive concept.

FIG. 18 depicts a plan view of a semiconductor device according to a fifth embodiment of the inventive concept.

Specifically, FIG. 18 is a plan view of the active region of the semiconductor device after the conductive regions have been formed.

The fifth embodiment of the semiconductor device can be manufactured using some or all the steps previously described with reference to FIGS. 3-11. The fifth and first embodiments of the semiconductor device are similar except for the following differences.

Referring to FIG. 18, the first gate electrode 2 is formed having a first enclosed pattern, and the inner and outer contours of the first enclosed pattern are circular. The outer contour of the N⁺ conductive region 3 is also circular.

According to the fifth embodiment of the semiconductor device, the parameter k(5) of the semiconductor device is given by the ratio of the circumference to the area of the circular N⁺ conductive region 3:

$$k(5) = \frac{\pi \times \text{Ln}}{\pi \times (\text{Ln}/2)^2} = \frac{4}{\text{Ln}} > \frac{2}{\text{Ln}} = k(0)$$

The parameter k(5) of the semiconductor device according to the fifth embodiment is greater than the parameter k(0) of the conventional long striped pattern gated diode. Comparing the fifth embodiment of the semiconductor device to an equivalent conventional long striped pattern gated diode in which both have the same ESD protection capability, the fifth embodiment of the semiconductor device has lower parasitic capacitance compared to the conventional gated diode. Accordingly, the fifth embodiment of the semiconductor device can help to improve the circuit performance of an RF integrated circuit.

In one embodiment, Lp and Lg may range from about 0.1 μm to about 2 μm. Ln may range from about 0.1 μm to about 10 μm.

Sixth Embodiment

Figure 19:
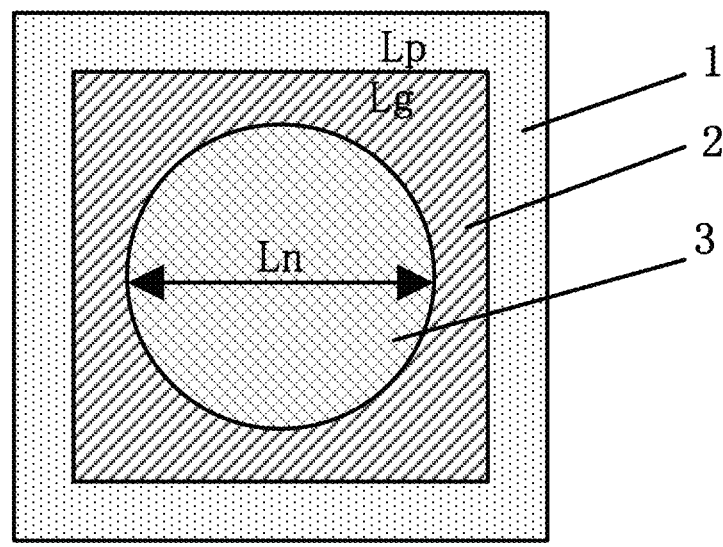
FIG. 19 depicts a plan view of a semiconductor device according to a sixth embodiment of the inventive concept.

FIG. 19 depicts a plan view of a semiconductor device according to a sixth embodiment of the inventive concept. Specifically, FIG. 19 is a plan view of the active region of the semiconductor device after the conductive regions have been formed.

The sixth embodiment of the semiconductor device can be manufactured using some or all the steps previously described with reference to FIGS. 3-11. The sixth and first embodiments of the semiconductor device are similar except for the following differences.

Referring to FIG. 19, the first gate electrode 2 is formed having a first enclosed pattern, and the inner contour of the first gate electrode 2 and the outer contour of the N⁺ conductive region 3 are circular. However, the outer contour of the first gate electrode 2 is square.

According to the sixth embodiment of the semiconductor device, the parameter k(6) of the semiconductor device is given by the ratio of the circumference to the area of the circular N⁺ conductive region 3:

$$k(6) = k(5) = \frac{\pi \times \text{Ln}}{\pi \times (\text{Ln}/2)^2} = \frac{4}{\text{Ln}} > \frac{2}{\text{Ln}} = k(0)$$

The parameter k(6) of the semiconductor device according to the sixth embodiment is greater than the parameter k(0) of the conventional long striped pattern gated diode.

Comparing the sixth embodiment of the semiconductor device to an equivalent conventional long striped pattern gated diode in which both have the same ESD protection capability, the sixth embodiment of the semiconductor device has lower parasitic capacitance compared to the conventional gated diode. Accordingly, the sixth embodiment of the semiconductor device can help to improve the circuit performance of an RF integrated circuit.

Seventh Embodiment

Figure 20:
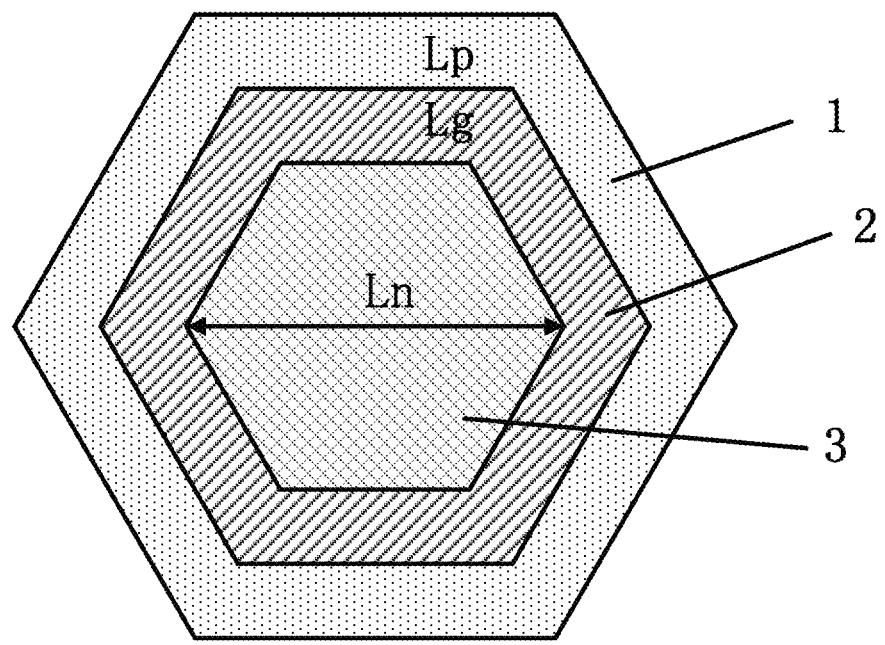
FIG. 20 depicts a plan view of a semiconductor device according to a seventh embodiment of the inventive concept.

FIG. 20 depicts a plan view of a semiconductor device according to a seventh embodiment of the inventive concept. Specifically, FIG. 20 is a plan view of the active region of the semiconductor device after the conductive regions have been formed.

The seventh embodiment of the semiconductor device can be manufactured using some or all the steps previously described with reference to FIGS. 3-11. The seventh and first embodiments of the semiconductor device are similar except for the following differences.

Referring to FIG. 20, the first gate electrode 2 is formed having a first enclosed pattern. The inner and outer contours of the first gate electrode 2 and the outer contour of the N⁺ conductive region 3 have regular hexagonal shapes.

According to the seventh embodiment of the semiconductor device, the parameter k(7) of the semiconductor device is given by the ratio of the perimeter length to the area of the hexagonal N⁺ conductive region 3:

$$k(7) = \frac{3 * \text{Ln}}{\frac{3}{8}\sqrt{3} * \text{Ln} * \text{Ln}} = \frac{4.62}{\text{Ln}} > \frac{2}{\text{Ln}} = k(0)$$

The parameter k(7) of the semiconductor device according to the seventh embodiment is greater than the parameter k(0) of the conventional long striped pattern gated diode. Comparing the seventh embodiment of the semiconductor device to an equivalent conventional long striped pattern gated diode in which both have the same ESD protection capability, the seventh embodiment of the semiconductor device has lower parasitic capacitance compared to the conventional gated diode. Accordingly, the seventh embodiment of the semiconductor device can help to improve the circuit performance of an RF integrated circuit.

It should be noted that the fifth to seventh embodiments of the semiconductor device differ from the first embodiment of the semiconductor device in that the shapes of the first gate electrode are different.

In the fifth to seventh embodiments, the isolation region is formed in the first region, whereby the isolation region is spaced apart from a boundary of the first region. Since the step of forming the isolation region in the first region is similar to the corresponding step previously described with reference to the second embodiment, a detailed description of the step shall not be repeated.

In the fifth to seventh embodiments, a second gate structure is formed on the well region, whereby the second gate structure is spaced apart from the first gate structure. The second gate structure includes a gate insulating layer and a second gate electrode formed on the gate insulating layer. The second gate electrode on the well region is formed having a second enclosed pattern, with the second enclosed pattern being surrounded by the first region. The area inside the second enclosed pattern is defined as a third region. Ion implantation is performed on the third region so as to form a region of the second conductivity type. An isolation region is formed in the third region, whereby the isolation region is spaced apart from a boundary of the third region. Since the steps of forming the second gate structure, the third region, and the isolation region in the third region are similar to the corresponding steps previously described with reference to the third and fourth embodiments, a detailed description of the step shall not be repeated.

Eighth Embodiment

Figure 21:
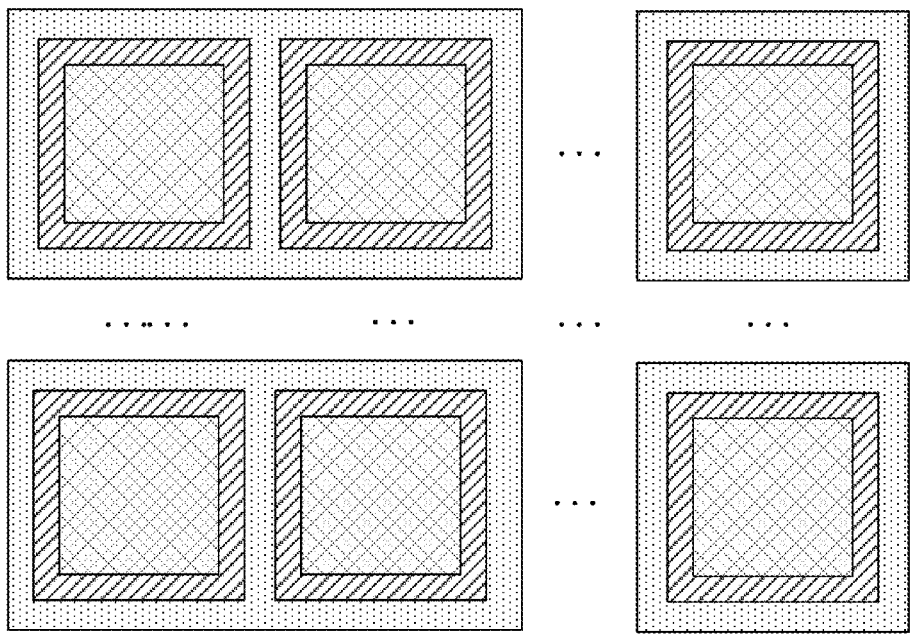
FIG. 21 depicts a plan view of a semiconductor device according to an eighth embodiment of the inventive concept.

FIG. 21 depicts a plan view of a semiconductor device according to an eighth embodiment of the inventive concept. Specifically, FIG. 21 is a plan view of the active region of the semiconductor device after the conductive regions have been formed.

Referring to FIG. 21, a plurality of cell structures are formed in a regular distribution on a substrate. Each of the cell structures includes the $N^+$ conductive region, gate electrode, and $P^+$ conductive region (extending in an outward direction) previously described with reference to the first embodiment in FIG. 10. The distribution of the plurality of cell structures (i.e. nested structure) causes the area of the $N^+$ region to increase, which increases the conduction current, thereby improving the current conduction capability of the semiconductor device.

In one embodiment, Lp and Lg may range from about 0.1 μm to about 2 μm, and Ln may range from about 0.1 μm to about 10 μm.

In one embodiment, a distance between adjacent cell structures may be given by Lp, as shown in FIG. 21.

In one embodiment, a distance between adjacent first gate electrodes may range from about 0.1 μm to about 2 μm.

Also, it should be noted that the cell structures may include any of the structures previously described in the second to seventh embodiments of the semiconductor device (for example, those depicted in FIGS. 12, 14, 16, and 18-20).

In one embodiment, the shape of the outermost $P^+$ conductive region in the cell structure should not be substantially different from the shape of the isolation groove. In particular, the shape of the outermost $P^+$ conductive region in the cell structure may be adapted to the shape of the isolation groove, as described below in the ninth embodiment of the semiconductor device.

Ninth Embodiment

Figure 22:
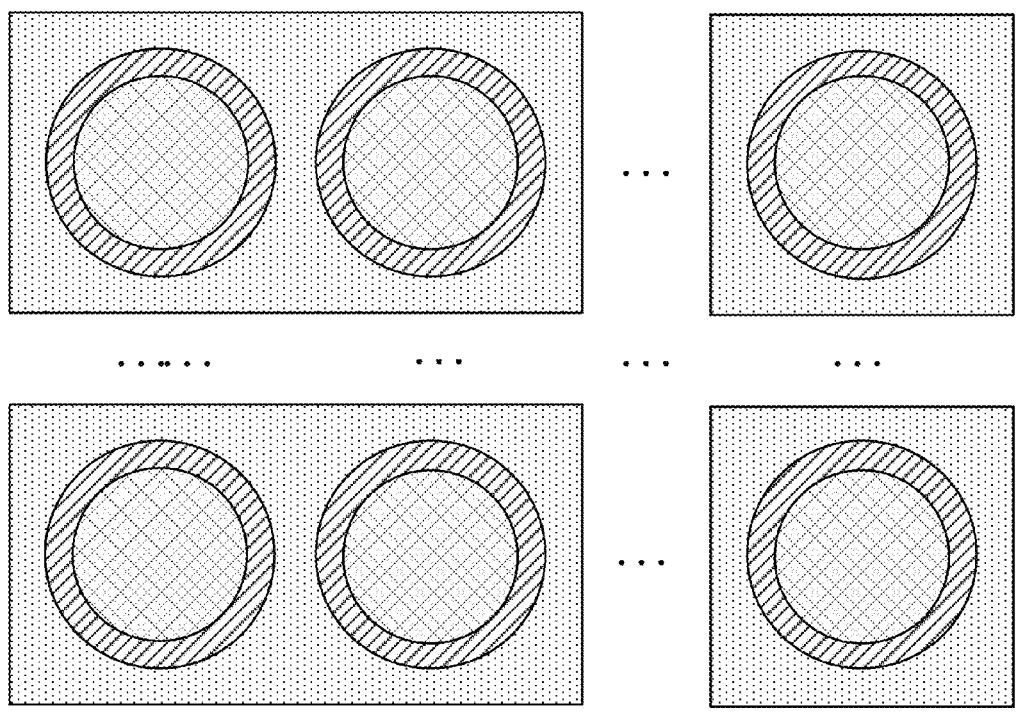
FIG. 22 depicts a plan view of a semiconductor device according to a ninth embodiment of the inventive concept.

FIG. 22 depicts a plan view of a semiconductor device according to an eighth embodiment of the inventive concept. Specifically, FIG. 22 is a plan view of the active region of the semiconductor device after the conductive regions have been formed.

The ninth embodiment in FIG. 22 is similar to the eighth embodiment in FIG. 21 except for the following difference.

Referring to FIG. 22, a plurality of cell structures are formed in a regular distribution on a substrate, and have the same cell structure as the fifth embodiment of FIG. 18. Although the outer contour of the $P^+$ conductive region in each cell structure has a circular shape (e.g. as that shown in FIG. 18), the outer contours are combined together in the distribution array to form a square shape, such that the shape of the outermost P+ conductive region in the cell structure is adapted to the shape of the isolation groove.

In one embodiment, a distance between adjacent cell structures may be given by Lp, as shown in FIG. 22.

In one embodiment, a distance between adjacent first gate electrodes may range from about 0.1 μm to about 2 μm.

According to another embodiment of the inventive concept, a semiconductor device is provided. The semiconductor device includes a substrate, a well region disposed on the substrate, and at least one first gate structure disposed on the well region. The first gate structure includes a gate insulating layer and a first gate electrode formed on the gate insulating layer. The first gate electrode is formed having a first enclosed pattern on the surface of the well region. The area inside the first enclosed pattern is defined as a first region, and the area outside the first enclosed pattern is defined as a second region. The first region includes a region of a first conductivity type, and the second region includes a region of a second conductivity type, whereby the first conductivity type and the second conductivity type are different.

In one embodiment, the semiconductor device may further include an isolation region disposed in the first region, whereby the isolation region is spaced apart from a boundary of the first region.

In one embodiment, the semiconductor device may further include a second gate structure formed on the well region, whereby the second gate structure is spaced apart from the first gate structure. The second gate structure includes a gate insulating layer and a second gate electrode formed on the gate insulating layer. The second gate electrode on the well region is formed having a second enclosed pattern, with the second enclosed pattern being surrounded by the first region. The area inside the second enclosed pattern is defined as a third region. The third region includes a region of the second conductivity type.

In one embodiment, the semiconductor device may further include an isolation region disposed in the third region, whereby the isolation region is spaced apart from a boundary of the third region.

In one embodiment, the ratio of the perimeters of the isolation region and the third region may range from about 0.25 to about 0.75.

In one embodiment, the well region is a P-type well region; the region of the first conductivity type is an $N^+$ region, and the region of the second conductivity type is a $P^+$ region.

In one embodiment, the first gate electrode is a polysilicon gate, and a distance between adjacent first gate electrodes may range from about 0.1 μm to about 2 μm.

In one embodiment, an inner contour and an outer contour of the first enclosed pattern, and an outer contour of the first isolation region, may have at least one of the following shapes: quadrilateral, pentagonal, hexagonal, octagonal, circular, and elliptical.

In one embodiment, the outer and inner contours of the first enclosed pattern and the outer and inner contours of the second enclosed pattern have the same shapes.

Embodiments of a semiconductor device and methods of manufacturing the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A method of manufacturing a semiconductor device, comprising:
   providing a substrate;
   forming a well region on the substrate;
   forming at least one first gate structure on the well region, wherein the first gate structure includes a gate insulating layer and a first gate electrode formed on the gate insulating layer,
   wherein the first gate electrode is formed having a first enclosed pattern on a surface of the well region;
   wherein an area inside the first enclosed pattern is defined as a first region, and an area outside the first enclosed pattern is defined as a second region;
   performing ion implantation on the first region such that the first region has a first conductivity type,
   performing ion implantation on the second region such that the second region has a second conductivity type,
   wherein the first conductivity type and the second conductivity type are different,
   forming a second gate structure on the well region, wherein the second gate structure is spaced apart from the first gate structure,
   wherein the second gate structure includes the gate insulating layer and a second gate electrode formed on the gate insulating layer,
   wherein the second gate electrode is formed having a second enclosed pattern on the surface of the well region, and the second enclosed pattern is surrounded by the first region,
   wherein an area inside the second enclosed pattern is defined as a third region; and
   performing ion implantation on the third region such that the third region has the second conductivity type.

2. The method according to claim 1, further comprising:
   forming a first isolation region in the first region, wherein the first isolation region is spaced apart from a boundary of the first region.

3. The method according to claim 2, wherein a ratio of a perimeter length of the first isolation region to a perimeter length of the first region ranges from about 0.25 to about 0.75.

4. The method according to claim 1, further comprising:
   forming a second isolation region in the third region, wherein the second isolation region is spaced apart from a boundary of the third region.

5. The method according to claim 4, wherein a ratio of a perimeter length of the second isolation region to a perimeter length of the third region ranges from about 0.25 to about 0.75.

6. The method according to claim 1, wherein: the well region is a P-type well region;
   the first region having the first conductivity type is an N+ conductive region; and
   the second region having the second conductivity type is a p+ conductive region.

7. The method according to claim 1, wherein the first gate electrode is a polysilicon gate, and a distance between adjacent first gate electrodes ranges from about 0.1 μm to about 2 μm.

8. The method according to claim 2, wherein an inner contour and an outer contour of the first enclosed pattern, and an outer contour of the first isolation region, have at least one of the following shapes: quadrilateral, pentagonal, hexagonal, octagonal, circular, and elliptical.

9. The method according to claim 1, wherein an outer contour and an inner contour of the first enclosed pattern, and an outer contour and an inner contour of the second enclosed pattern, have the same respective shapes.

* * * * *